United States Patent
Jung et al.

(10) Patent No.: US 9,997,208 B1
(45) Date of Patent: Jun. 12, 2018

(54) HIGH-SPEED LEVEL SHIFTER

(71) Applicant: QUALCOMM Incorporated, San Diego, CA (US)

(72) Inventors: Chulmin Jung, San Diego, CA (US); Po-Hung Chen, San Diego, CA (US); Fahad Ahmed, San Diego, CA (US); Changho Jung, San Diego, CA (US); Sei Seung Yoon, San Diego, CA (US); David Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1 day.

(21) Appl. No.: 15/473,124

(22) Filed: Mar. 29, 2017

(51) Int. Cl.
G11C 8/08 (2006.01)
G11C 5/14 (2006.01)
H03K 19/0185 (2006.01)
G11C 8/10 (2006.01)
G11C 7/12 (2006.01)

(52) U.S. Cl.
CPC ............... G11C 5/147 (2013.01); G11C 7/12 (2013.01); G11C 8/10 (2013.01); H03K 19/018528 (2013.01)

(58) Field of Classification Search
CPC ........................................................ G11C 8/08
USPC .................................................... 365/189.11
See application file for complete search history.

(56) References Cited

U.S. PATENT DOCUMENTS

| | | | |
|---|---|---|---|
| 5,900,750 A * | 5/1999 | Schmitt .......... | H03K 19/018521 326/121 |
| 6,501,306 B1 | 12/2002 | Kim et al. | |
| 6,781,415 B2 | 8/2004 | Clark et al. | |
| 6,888,394 B2 * | 5/2005 | Cleary ............. | H03K 3/356113 326/68 |
| 7,511,552 B2 * | 3/2009 | Ali ......................... | H03K 3/012 326/62 |
| 7,541,837 B2 * | 6/2009 | Lines ....................... | G11C 8/08 326/68 |
| 7,884,645 B2 * | 2/2011 | Chen ................ | H03K 3/356113 326/81 |
| 8,102,199 B2 * | 1/2012 | Chou ............... | H03K 3/356113 326/68 |
| 8,324,934 B1 | 12/2012 | Truong et al. | |
| 8,368,425 B2 * | 2/2013 | Huang ............. | H03K 3/356182 326/68 |
| 8,410,839 B2 | 4/2013 | Larsen et al. | |
| 8,421,518 B2 | 4/2013 | Larsen | |

(Continued)

FOREIGN PATENT DOCUMENTS

GB    2390239 A * 12/2003  ....... H03K 3/356113

*Primary Examiner* — Son Mai
(74) *Attorney, Agent, or Firm* — Loza & Loza, LLP/Qualcomm

(57) ABSTRACT

A circuit including an output node and a cross-coupled pair of semiconductor devices configured to provide, at the output node, an output signal in a second voltage domain based on an input signal in a first voltage domain is described herein. The circuit further includes a pull-up assist circuit coupled to the output node; and a look-ahead circuit coupled to the pull-up assist circuit, wherein the look-ahead circuit is configured to cause the pull-up assist circuit to assist in increasing a voltage level at the output node when there is a decrease in a voltage level of an inverted output signal in the second voltage domain from a high voltage level of the second voltage domain to a low voltage level of the second voltage domain.

23 Claims, 9 Drawing Sheets

(56) References Cited

U.S. PATENT DOCUMENTS

| | | | | |
|---|---|---|---|---|
| 8,638,618 | B2 * | 1/2014 | Hung | G11C 8/10 |
| | | | | 365/185.17 |
| 8,669,803 | B2 * | 3/2014 | Huang | H03K 3/356104 |
| | | | | 326/68 |
| 9,432,022 | B2 * | 8/2016 | Jung | H03K 19/018521 |
| 9,444,463 | B2 * | 9/2016 | Rao | H03K 19/018528 |

* cited by examiner

HIGH-SPEED LEVEL SHIFTER

BACKGROUND

Field

Aspects of the present disclosure relate generally to memories, and more particularly, to a high-speed level shifter.

Background

As semiconductor technology has advanced into the sub-micron region, power supply voltage is scaled down in concert with the scaling down of transistor dimensions. For example, microprocessors are now manufactured with transistors that operate in a low-voltage domain that can include supply voltage levels as low as sub-one volt. These microprocessors typically include designs that use dual power rails, each having a different voltage domain. In these implementations, circuitry in a low-voltage domain may still need to interface with circuitry that operates in a higher-voltage domain. To save power, circuitry for memory address decoding that generates addressing signals for memory circuits such as word line select signals, operates in the low-voltage domain. However, the resulting decoded word line select signal must then be level-shifted up into the higher-voltage domain of the memory to drive the selected word line. In these dual voltage rail approaches, a level shifter circuit is used to shift voltage levels for memory addressing signals (such as the word line select signal) from an input signal in a first voltage domain with a first voltage level to an output signal in a second, higher-voltage domain with a second voltage level.

Traditional level shifters, which has an output that falls fast and rises slowly, will cause a large timing window for these logic transitions. Large timing windows translate into large setup/hold windows that negatively affect current designs. For example, uneven output transition times will result in a timing hit wherever a level shifter logic is used. At higher operating speeds, conventional level shifting approaches introduce too much delay.

Accordingly, there is a need in improved memory designs for improved level shifting speeds, such as for transitions from a low-voltage domain to a high-voltage domain, while still supporting wider voltage level ranges between these domains.

SUMMARY

The following presents a simplified summary of one or more aspects of the disclosed approach, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a circuit including an output node and a cross-coupled pair of semiconductor devices configured to provide, at the output node, an output signal in a second voltage domain based on an input signal in a first voltage domain. The circuit further includes a pull-up assist circuit coupled to the output node; and a look-ahead circuit coupled to the pull-up assist circuit, wherein the look-ahead circuit is configured to cause the pull-up assist circuit to assist in increasing a voltage level at the output node when there is a decrease in a voltage level of an inverted output signal in the second voltage domain from a high voltage level of the second voltage domain to a low voltage level of the second voltage domain.

Another aspect of the disclosure provides circuit having an output node and a cross-coupled pair of semiconductor devices configured to provide, at the output node, an output signal in a second voltage domain based on an input signal in a first voltage domain. The circuit further includes pull-up assist means for increasing a voltage level at the output node; and look-ahead means for causing the pull-up assist means to increase the voltage level at the output node when there is a decrease in a voltage level of an inverted output signal in the second voltage domain from a high voltage level of the second voltage domain to a low voltage level of the second voltage domain.

Yet another aspect of the disclosure provides a method that, in a cross-coupled pair of semiconductor devices configured to provide an output signal in a second voltage domain based on an input signal in a first voltage domain, generates an inverted output signal based on the output signal. The method also includes detecting a decrease in a voltage level of the inverted output signal in the second voltage domain from a high voltage level of the second voltage domain to a low voltage level of the second voltage domain; and increasing a voltage level at the output node when the decrease of the voltage level of the inverted output signal has been detected.

Still yet another aspect of the disclosure provides a processing system including a memory circuit configured to operate in a first voltage domain; a processing circuit configured to operate in a second voltage domain and further configured to access the memory circuit using an address signal; and a level shifter coupled to the processing circuit and the memory circuit and configured to translate the address signal. The level shifter includes an output node and a cross-coupled pair of semiconductor devices configured to provide, at the output node, an output signal in the second voltage domain based on the address signal in the first voltage domain. The level shifter further provides a pull-up assist circuit coupled to the output node; and a look-ahead circuit coupled to the pull-up assist circuit, wherein the look-ahead circuit is configured to cause the pull-up assist circuit to assist in increasing a voltage level at the output node when there is a decrease in a voltage level of an inverted output signal in the second voltage domain from a high voltage level of the second voltage domain to a low voltage level of the second voltage domain.

These and other aspects of the disclosure will become more fully understood upon a review of the detailed description, which follows.

BRIEF DESCRIPTION OF THE DRAWINGS

These and other sample aspects of the disclosure will be described in the detailed description that follow, and in the accompanying drawings.

Figure 1:
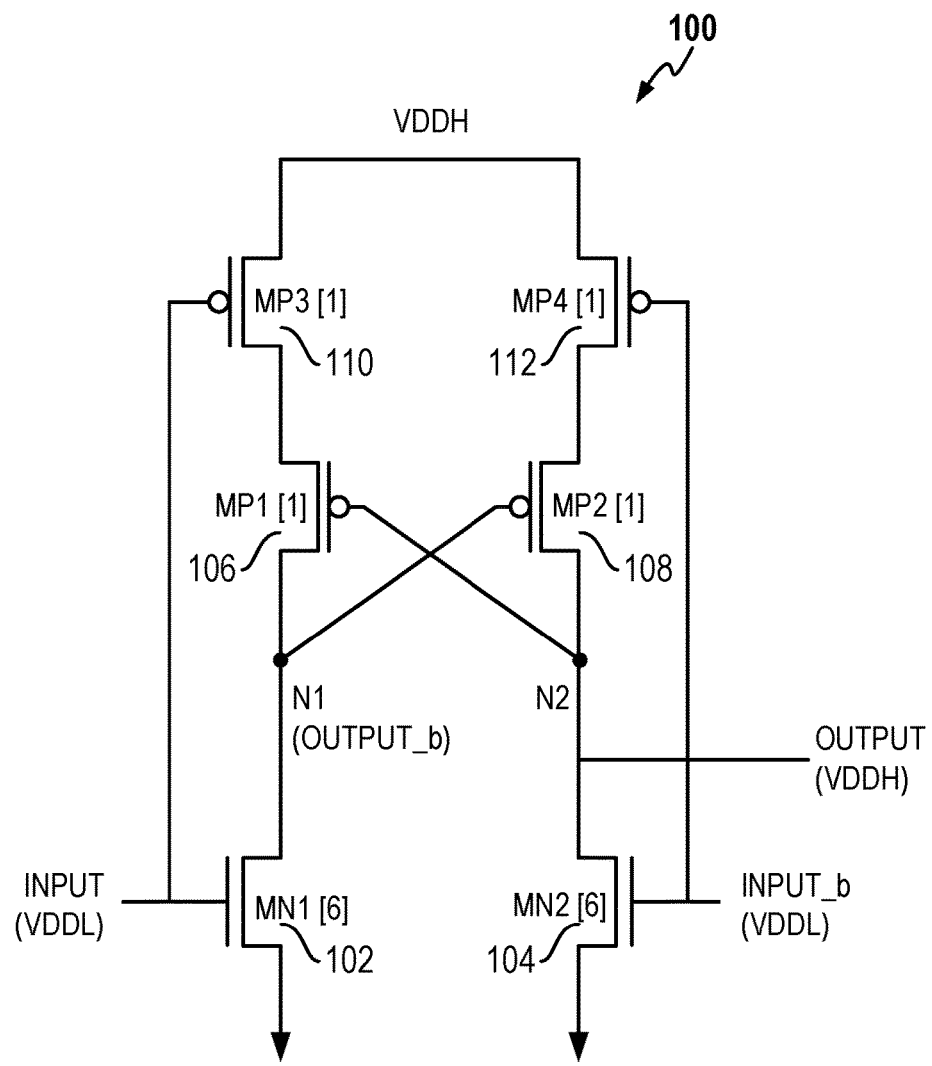
FIG. 1 is a circuit diagram of a prior art level shifting circuit.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

A conventional level shifter 100 as shown in FIG. 1 may perform voltage level shifting, in a dual voltage rail system, for a word line select signal from an input signal (INPUT) in a first voltage domain with a first voltage level (VDDL) to an output signal (OUTPUT) in a second, higher voltage domain with a second voltage level (VDDH). The input signal drives a gate of an NMOS transistor MN1 102. If the input signal is low (ground or VSS), the NMOS transistor MN1 102 switches off, allowing a node N1, effectively where an inverted output signal (OUTPUT_b) may be found, to float with respect to ground. An inverted input signal (INPUT_b) drives a gate of an NMOS transistor MN2 104. The value of the inverted input signal should be VDDL when the input signal is low, which switches on the NMOS transistor M2 104 to pull a node N2 to ground. The output signal is taken from the node N2.

Continuing to refer to FIG. 1, the node N2 is coupled to a gate of a PMOS transistor MP1 106 that has its drain coupled to the node N1. The PMOS transistor MP1 106 is cross-coupled with respect to a PMOS transistor MP2 108. The input signal also drives a gate of a PMOS transistor MP3 110 in series with transistor MP1 106. When the input signal is low, both the PMOS transistor MP3 110 and the PMOS transistor MP1 106 will be on, which charges the node N1 to the second higher voltage domain power supply level, the second voltage level VDDH. The node N1 drives the gate of the PMOS transistor MP2 108 coupled to the node N2. The PMOS transistor MP2 108 will thus be off when the input signal is low. Another PMOS transistor MP4 112 that has its gate driven by the inverted input signal is in series with the PMOS transistor MP3 110.

In response to the input signal switching high to VDDL, the NMOS transistor MN1 102 will switch on and the NMOS transistor M2 104 will switch off. The output node N2, which had been discharged while the input signal was low, must then float until the PMOS transistor MP2 108 can be switched on. In turn, the PMOS transistor MP2 108 cannot switch on until the NMOS transistor MN1 102 can discharge the node N1. However, the PMOS transistor MP1 106 is still momentarily on and attempting to keep the node N1 charged, which thus fights with the NMOS transistor MN1 102 discharging the node N1. The PMOS transistor MP3 110 is only weakly on because VDDL is effectively a weak zero with regard to VDDH. The PMOS transistor MP3 110 thus assists NMOS transistor MN1 102 in terms of discharging the node N1 by restricting the flow of charge to the PMOS transistor MP1 106. Once the node N1 is discharged, the PMOS transistor MP2 108 will switch on. Since the PMOS transistor MP4 112 will already be on due to the inverted input signal being driven low, the switching on of the PMOS transistor MP2 108 will charge the output signal to VDDH. An analogous struggle occurs between the NMOS transistor M2 104 and the PMOS transistor MP2 108 when the inverted input signal is driven to VDDL in response to the input signal transitioning low.

The fight between the NMOS and PMOS transistors in the level shifter 100, which adversely affects memory timing due to the delay incurred during the NMOS/PMOS struggle, is exacerbated where the size of pull-down transistors, such as the NMOS transistors MN1 and MN2, are skewed to allow the level shifter to perform output transitions at more extreme voltage level differentials (e.g., low input, high output). In other words, this differential is desirable so that the level shifter 100 may operate for larger dual-rail voltage ranges, but the skewing affects the timing negatively. In the level shifter 100, the P/N ratio is 1:1:6, as indicated in the brackets next to each transistor. Specifically, with respect to the timing, the level shifter 100 will have a lower rising speed but a high dropping speed at the output.

To eliminate the delay in conventional level-shifting, a level shifter is provided that includes look-ahead and pull-up assist features that increases the speed of the level shifting for rising output signals (i.e., where the output rises from ground to the voltage level of the higher voltage domain). The look-ahead features operate as a predictive function to ensure the pull-up assist feature is ready to help in increasing the rate at which an output signal transitions from low (e.g., 0) to high (e.g., VDDH) when an input signal is switched from low (e.g., 0) to high (e.g., VDDL).

Figure 2:
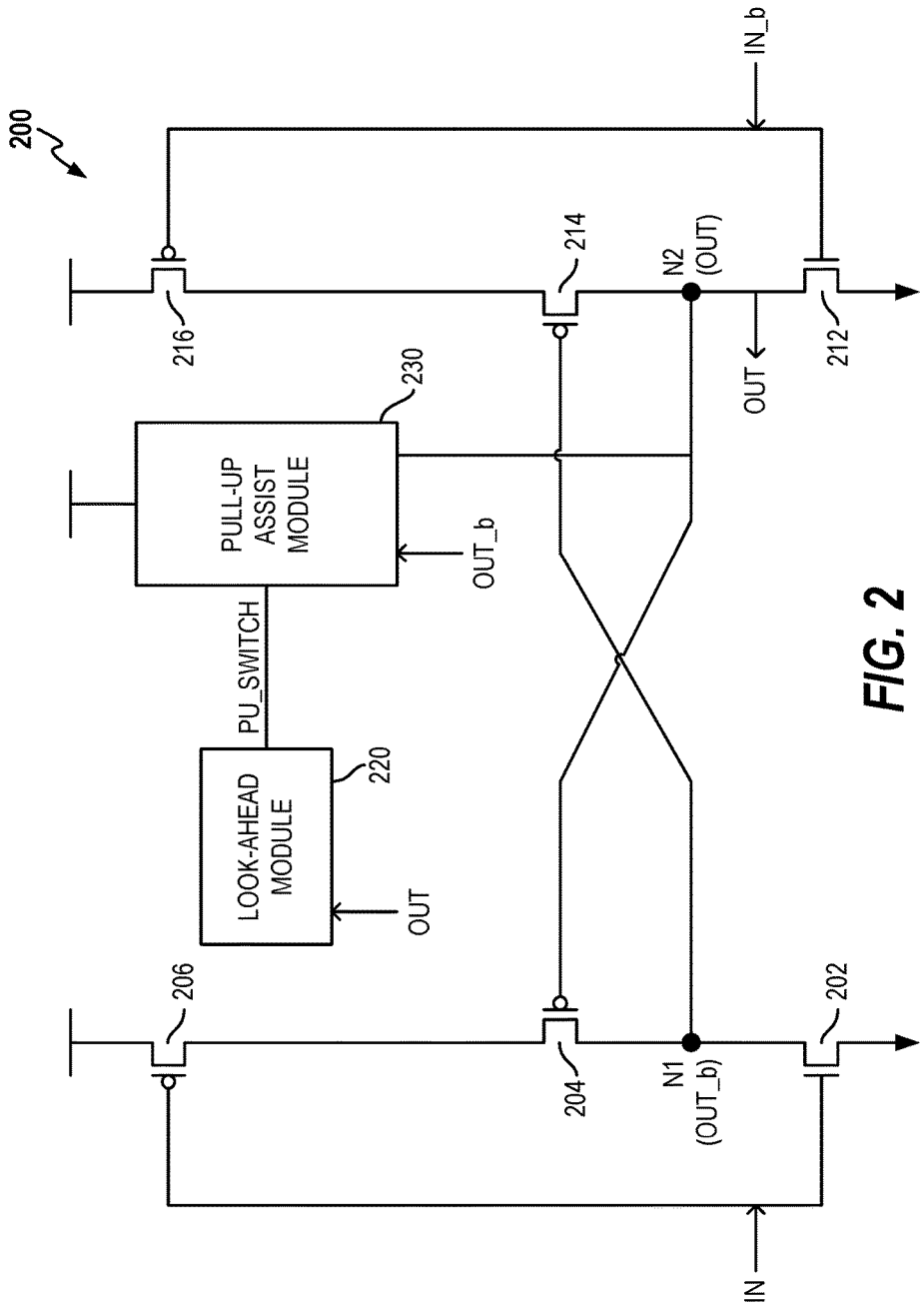
FIG. 2 is a conceptual diagram of a level shifter configured in accordance with one aspect of a high-speed level shifter described herein.

A level shifter 200 is provided in FIG. 2 that includes a look-ahead module 220 and a pull-up assist module 230 that provides the look-ahead feature and the pull-up assist feature, respectively. The pull-up assist module 230 provides assistance in increasing the charge at an output node (OUT) when there is a rising input signal transition at an input node (IN) so that the increased charge allows an output signal to rise faster (i.e., the output signal rises from ground to the voltage level of the higher voltage domain). The look-ahead module 220 provides presetting of the pull-up assist module 230 to assist the level shifter 200 during the rising transition. The level shifter 200 also includes an inverted input node (IN_b) and an inverted output node (OUT_b) where signals configured to be the complements of the signals at the input node and the output node, respectively, are found. The level shifter 200 includes a cross-coupled pair of transistor chains including a first transistor chain with an NMOS transistor 202, a PMOS transistor 204, and a PMOS transistor 206; and, a second transistor chain with an NMOS transistor 212, a PMOS transistor 214, and a PMOS transistor 216. With the exception of the changes described herein due to the inclusion of the look-ahead module 220 and the pull-up assist module 230 in the level shifter 200, it may be assumed that the NMOS transistor 202, the PMOS transistor 204, and the PMOS transistor 206 of FIG. 2 are configured and operate similarly to the NMOS transistor MN1 102, the PMOS transistor MP1 106, and the PMOS transistor MP3 110, respectively, of FIG. 1. It may similarly be assumed that the NMOS transistor 212, the PMOS transistor 214, and the PMOS transistor 216 of FIG. 2 are configured and operate similarly to the NMOS transistor MN2 104, the PMOS transistor MP2 108, and the PMOS transistor MP4 112, respectively, of FIG. 1. Through these assumptions, description that may be duplicative may be avoided.

Figure 3:
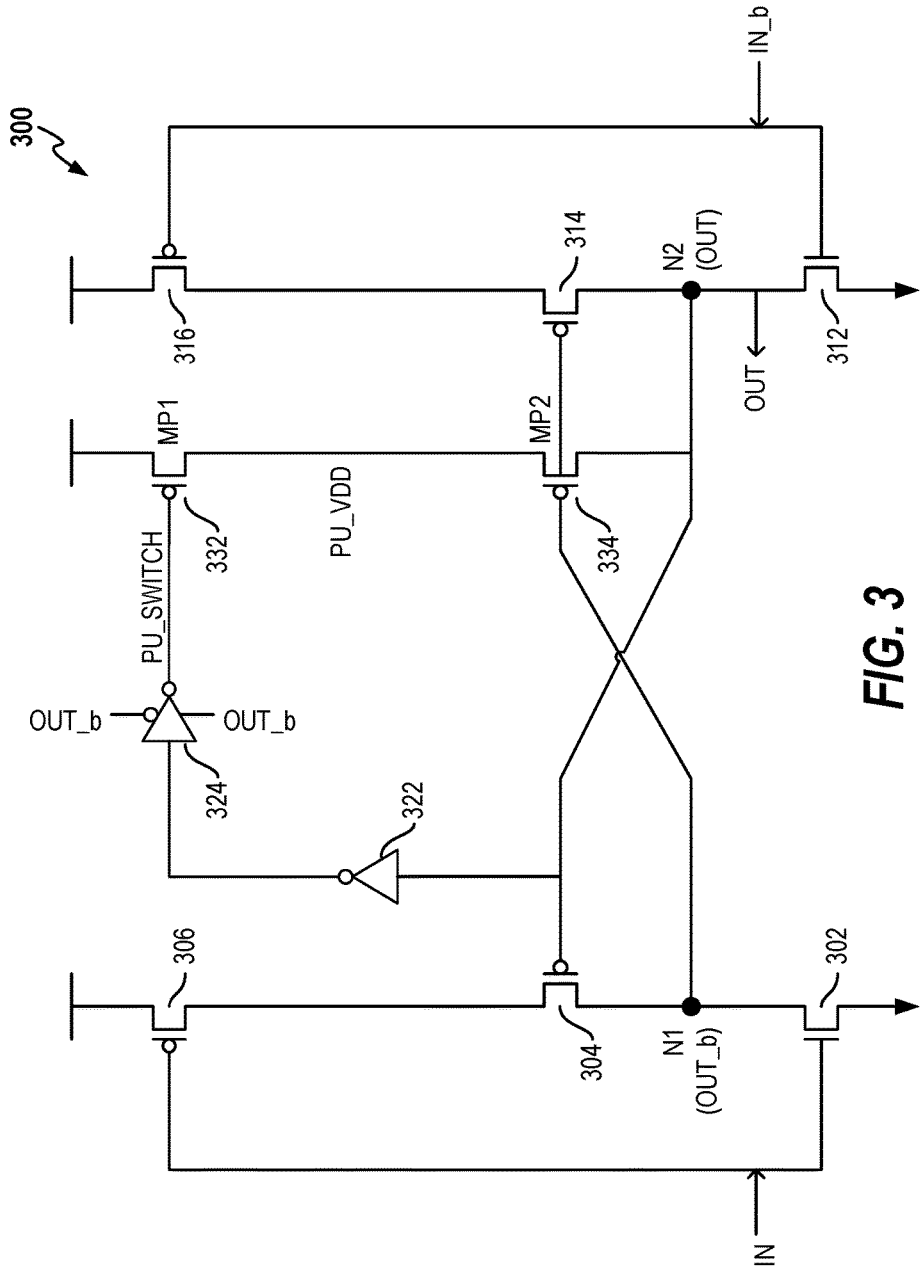
FIG. 3 is a block diagram of a level shifter configured in accordance with the level shifter of FIG. 2.

FIG. 3 illustrates an example implementation of the look-ahead module 220 and the pull-up assist module 230 in a level shifter 300 that similarly includes an input node (IN) and an output node (OUT) as well as an inverted input node (IN_b) and an inverted output node (OUT_b) that are configured to be the complements of the signals at the input node and the output node, respectively. The level shifter 300 includes a cross-coupled pair of transistor chains including a first transistor chain with an NMOS transistor 302, a PMOS transistor 304, and a PMOS transistor 306; and, a second transistor chain with an NMOS transistor 312, a PMOS transistor 314, and a PMOS transistor 316. It should be noted that the comments regarding avoidance of duplicative description of the configuration and operation for the cross-coupled pair of transistor chains in the level shifter 200 of FIG. 2 applies equally to the cross-coupled pair of transistor chains in the level shifter 300.

In one aspect of the disclosed high-speed level shifter, the pull-up assist module 230 may be implemented as an extra pull-up chain with a pair of PMOS transistors to enhance the rising speed for one side of the level shifter 300. The pair of PMOS transistors are shown as a PMOS transistor MP1 332 and a PMOS transistor MP2 334. The look-ahead module 220 may be implemented by two inverters that provide a pull-up switch signal (PU_SWITCH) to operate the pull-up assist module 230. The two inverters are shown as a first inverter 322 and a second inverter 324, and operate as a detecting scheme that provides a slower transition for the value of the signal PU_SWITCH as it follows each change in value of the output signal. Thus, when the output signal transitions from high-to-low, preferably the signal PU_SWITCH should transition from high-to-low as well, but transition slower than that of the output signal. The same slower transition for the signal PU_SWITCH as compared to the transition of the output signal is also desired when the output signal transitions from low-to-high. In one aspect of the disclosed high-speed level shifter, the second inverter 324 may be implemented using a tri-state device so that the signal PU_SWITCH may be transitioned when both the output signal and the inverted output signal are completely transferred.

Continuing to refer to FIG. 3, when the output signal at the output node is low, the signal PU_SWITCH will also be low. This will open up the PMOS transistor MP1 332 and pre-charge the signal at a pull-up assist node (PU_VDD) between the PMOS transistor MP1 332 and the PMOS transistor MP2 334 to wait for a coming rising signal. In other words, the signal PU_SWITCH will turn on the PMOS transistor MP1 332 and pre-charge the PU_VDD node after the output signal at the output node starts falling to 0, and thereby await the coming rising transition for the output signal. Further, when the output signal is low, an inverted output signal at the node OUT_b will be high, which turns off the PMOS transistor MP2 334. Thus, output of the PMOS transistor MP2 334 does not affect the output signal at the output node.

When the input signal transitions from low to high (e.g., from ground to VDDL), the inverted output signal will be pulled down first, which will turn on the PMOS transistor MP2 334. Effectively, it may be said that the NMOS transistor 302 coupled to the node OUT_b will bring the inverted output signal down very quickly because of the fast falling transition provided by the strong NMOS transistor receiving the input signal at node IN. Once the PMOS transistor MP2 334 is turned on, because the PU_VDD node is already pre-charged, the output signal at the node OUT may be pulled-up quickly.

After the output signal rises to high (i.e., VDDH), the signal PU_SWITCH will turn off the PMOS transistor MP1 332 so the speed for the coming falling transition will not be affected by the PMOS transistor MP1 332 and the PMOS transistor MP2 334. In effect, whether the signal PU_SWITCH is switching the PMOS transistor MP1 332 off or on, it is desirable for the signal PU_SWITCH to switch the PMOS transistor MP1 332 in a manner that follows timing of the transition of the output signal.

In one aspect of the disclosed high-speed level shifter, the PMOS transistor MP1 332 and the PMOS transistor MP2 334 in the level shifter 300 may be much stronger than the other PMOS transistors used in the level shifter. For example, the PMOS transistor MP1 332 and the PMOS transistor MP2 334 may be similarly sized to the NMOS transistor 312.

In another aspect of the disclosed high-speed level shifter, the second inverter 324 is controlled by the inverted output signal at the node OUT_b, which transitions slower than the output signal at the node OUT because it may be desirable to wait for the transition of the output signal to be complete before the signal PU_SWITCH is changed. Effectively, the second inverter 324 may be used to implements a detection scheme that will transition the signal PU_SWITCH only when the output signal and the inverted output signal at the node OUT and the node OUT_b, respectively, have completely transitioned (i.e., settled to a steady state).

In certain memory designs, a static voltage scaling (SVS) signal may be used to slow down memory operations when the external, system level circuits interfacing with the memory is operating in low voltage (e.g., low power) modes. Specifically, the SVS signal will be high to enable a slower mode of operation for the memory when VDDL is lower because that lower VDDL will slow down the other circuits (e.g., external logic) to which the memory is interfacing and the memory needs to operate at a commensurate speed.

Certain issues may arise when static voltage scaling is enabled. Continuing to take the level shifter 300 of FIG. 3 as an example, during low voltage conditions, if the output signal and the inverse output signal are not able to settle quickly, then the signal PU_SWITCH will be in an unknown state. The signal PU_SWITCH will turn on the PMOS transistor MP1 332, which will cause lag when the level shifter 300 is attempting to pull down the output signal at the node OUTPUT because the PMOS transistor MP2 334 will attempt to maintain the output signal at a high level, which is undesirable.

Figure 4:
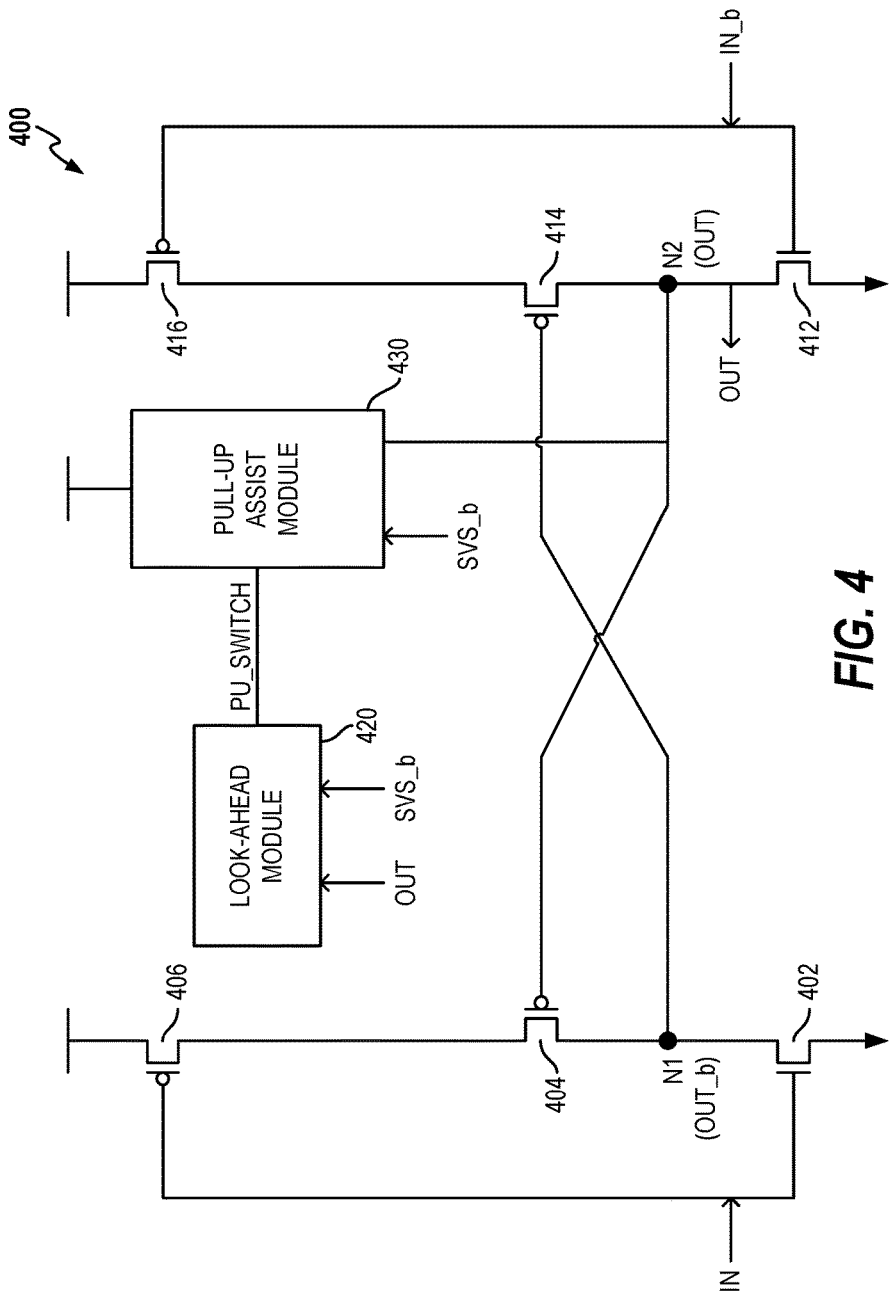
FIG. 4 is a conceptual diagram of another level shifter configured in accordance with another aspect of the high-speed level shifter described herein.

FIG. 4 illustrates another example implementation of a level shifter 400 configured in accordance with various aspects of the high-speed level shifter described herein that includes a look-ahead module 420 and a pull-up assist module 430. Unless otherwise described herein, the configuration and the operation of the level shifter 400 is similar to the configuration and operation of the level shifter 200 as shown in FIG. 2. Thus, for example, the configuration and operation of a cross-coupled pair of transistor chains in the level shifter 400 that includes a first transistor chain with an NMOS transistor 402, a PMOS transistor 404, and a PMOS transistor 406; and a second transistor chain with an NMOS transistor 412, a PMOS transistor 414, and a PMOS transistor 416, is similar to that noted for the cross-coupled pair of transistor chains in the level shifter 200 as described above.

In accordance with various aspects of the high-speed level shifter disclosed herein, the look-ahead module 420 provides a mode selection switch function for protection against unwanted noise/margin. For example, to address any potential issues when the static voltage scaling mode is enabled, the look-ahead module 420 may be configured with the ability to disable operation of the pull-up assist module 430. In one aspect of the disclosed high-speed level shifter, the look-ahead module 420 may receive an inverted static voltage scaling (SVS_b) signal and, based on the value of that SVS_b signal, may prevent operation of the pull-up assist module 430. The speed and performance of the level shifter 400 with the pull-up assist function disabled (i.e., when the pull-up assist module 430 is disabled) will be similar to a conventional level shifter.

Figure 5:
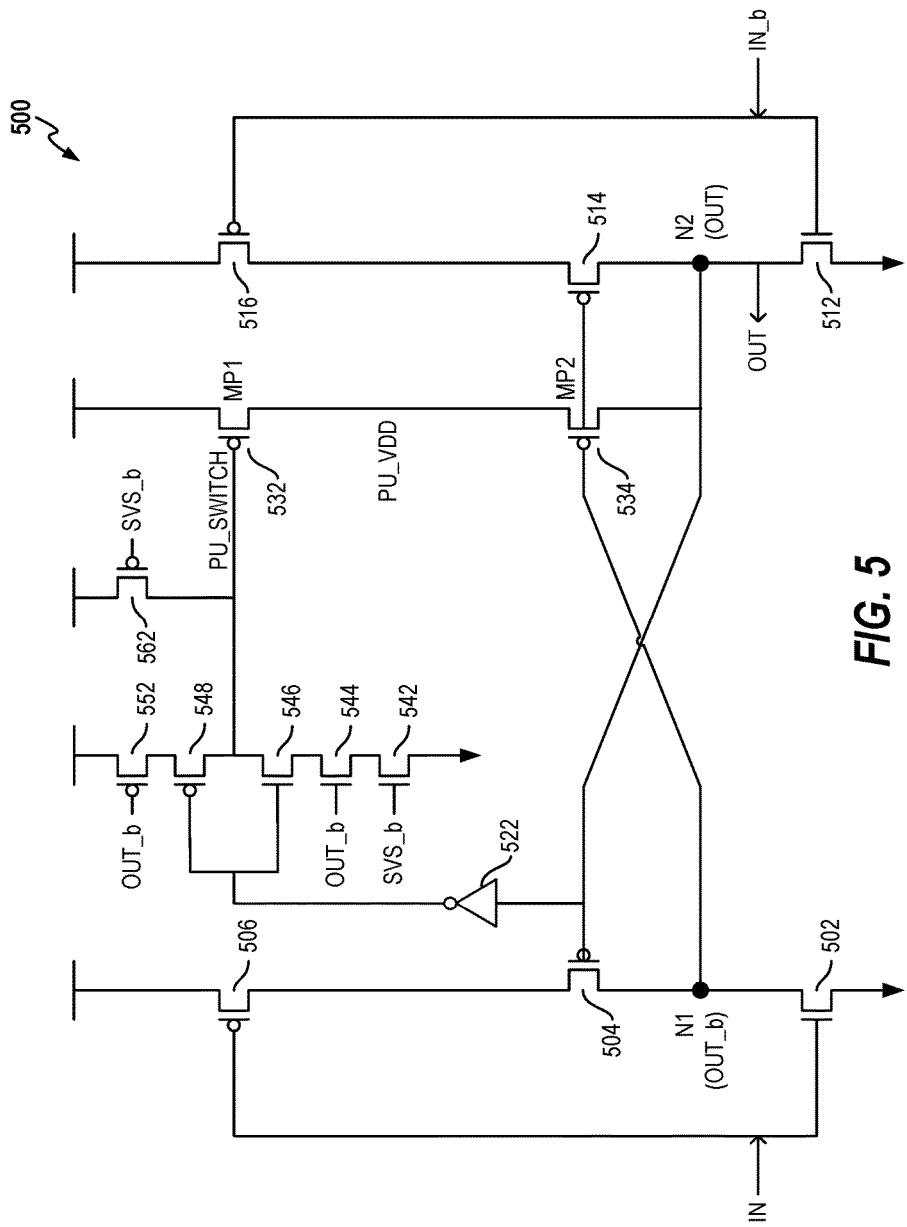
FIG. 5 is a block diagram of a level shifter configured in accordance with the level shifter of FIG. 4.

FIG. 5 illustrates an example implementation of the look-ahead module 420 and the pull-up assist module 430 in a level shifter 500. Similar to the configuration of the pull-up assist module 230 as implemented in the level shifter 300 of FIG. 3, the pull-up assist module 430 may be implemented as an extra pull-up chain with a pair of PMOS transistors to enhance the rising speed for one side of the level shifter 500. The pair of PMOS transistors are shown as a PMOS transistor MP1 532 and a PMOS transistor MP2 534.

To address any potential issues when static voltage scaling is enabled, the look-ahead module as implemented in the level shifter 500 of FIG. 5 includes the ability to disable operation of the extra pull-up chain that includes the PMOS transistor MP1 532 and the PMOS transistor MP2 534. In the level shifter 500, the signal SVS_b will be low to keep the signal PU_SWITCH high so as to disable operation of the PMOS transistor MP1 532, and thereby disable the operation of the pull-up assist function. Specifically, when the PMOS transistor 562 receives, at its gate, the signal SVS_b, then the PMOS transistor 562 will be enabled and the PU_SWITCH signal will be high. Similarly, a NMOS transistor 542 also receives the signal SVS_b to cutoff the pull-down at the NMOS transistor 542 to avoid a potential short-circuit when PMOS transistor 562 is enabled. In other words, the signal SVS_b, being provided to both the NMOS transistor 542 and the PMOS transistor 562, will enable only one of these transistors.

The level shifter 500 includes a complementary pair of transistors including an NMOS transistor 546 and a PMOS transistor 548 that implement an inverter function that receives output from an inverter 522 that is similar to the first inverter 322 in the level shifter 300 in FIG. 3. The level shifter 500 also includes an NMOS transistor 544 and a PMOS transistor 552 that receives the inverted output signal to implement the tri-state functionality as discussed above.

Figure 6:
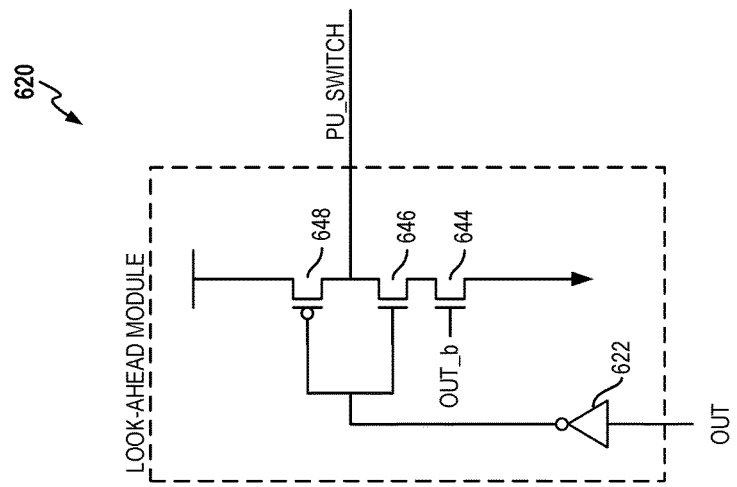
FIG. 6 is a block diagram illustrating a look-ahead module that may be implemented in the level shifter of FIG. 2.

FIG. 6 illustrates a look-ahead module 620 that may be used to implemented the look-ahead module 220 of FIG. 2 in accordance with various aspects of the disclosed high-speed level shifter, where a complementary pair of transistors including an NMOS transistor 646 and a PMOS transistor 648 that implement an inverter function that receives output from an inverter 622 that is similar to the first inverter 322 in the level shifter 300 in FIG. 3. A PMOS transistor 644 may be used to receive the inverted output signal and control the operation of the look-ahead module 620 in generating the signal PU_SWITCH based on the value of the inverted output signal.

Figure 7:
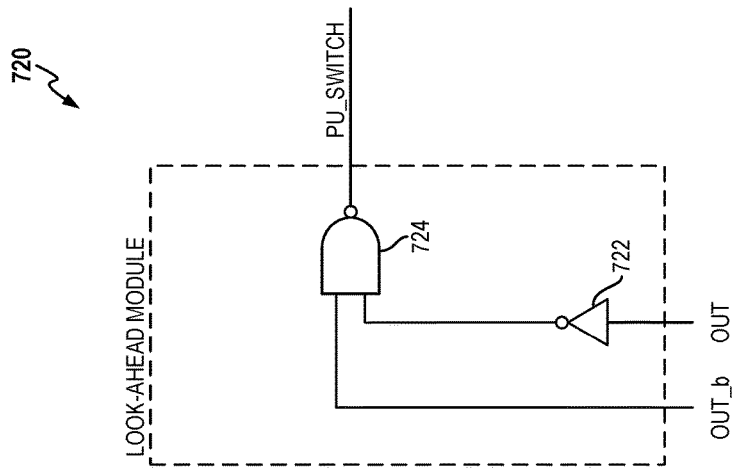
FIG. 7 is a block diagram illustrating another look-ahead module that may be implemented in the level shifter of FIG. 2.

FIG. 7 illustrates a look-ahead module 720 that may be used to implemented the look-ahead module 220 of FIG. 2 in accordance with various aspects of the disclosed high-speed level shifter where a NAND gate 724 that implement a NAND function using, as inputs, the inverted output signal as well as an output from an inverter 722 that is similar to the first inverter 322 in the level shifter 300 in FIG. 3. Thus, the value of the signal PU_SWITCH is based on an output of the NAND gate 724 based on the values of the inverted output signal and the inverted output signal, where the signal PU_SWITCH is low only when the output signal has settled into a steady state of low and the inverted output signal has settled into a steady state of high. With these inputs, the NAND gate 724 will output a high value as the signal PU_SWITCH.

Figure 8:
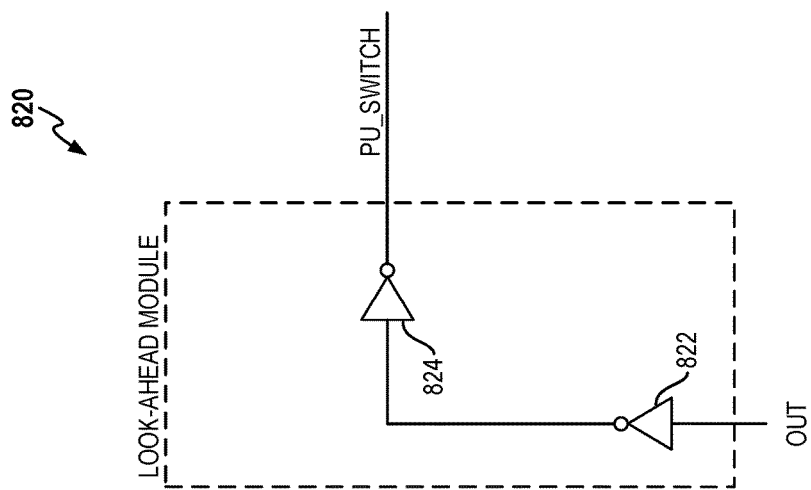
FIG. 8 is a block diagram illustrating yet another look-ahead module that may be implemented in the level shifter of FIG. 2.

FIG. 8 illustrates a look-ahead module 820 that may be used to implemented the look-ahead module 220 of FIG. 2 in accordance with various aspects of the disclosed high-speed level shifter where the look-ahead module 820 includes a first inverter 822 and a second inverter 824 coupled in series. The second inverter 824 receive an output from the first inverter 822 that is similar to the first inverter 322 in the level shifter 300 in FIG. 3. Thus, the value of the signal PU_SWITCH is based on an output of the second inverter 824 based on the output of the first inverter 822, which takes as its input the output signal. The signal PU_SWITCH is generated in manner similar to the look-ahead module is implemented by the first inverter 322 and the second inverter 324 in the level shifter 300 of FIG. 3, except the second inverter 324 does not operate as a tri-state device.

Figure 9:
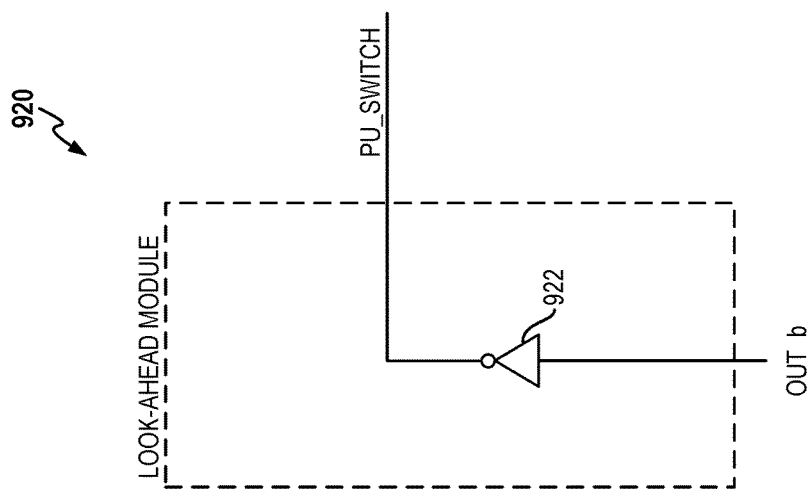
FIG. 9 is a block diagram illustrating still yet another look-ahead module that may be implemented in the level shifter of FIG. 2.

FIG. 9 illustrates a look-ahead module 920 that may be used to implemented the look-ahead module 220 of FIG. 2 in accordance with various aspects of the disclosed high-speed level shifter where the look-ahead module 920 includes an inverter 922 that is similar to the first inverter 322 in the level shifter 300 in FIG. 3. The value of the signal PU_SWITCH is based on an output of the inverter 922, which takes as its input the inverted output signal. Thus, when the inverted output signal is high, then the signal PU_SWITCH is low.

It should be clear from the disclosure contained herein that any of the look-ahead modules shown and described herein may include a function to disable operation of a pull-up assist module to which the look-ahead module is coupled similar to the operation of the look-ahead module 520 in FIG. 5. Further, the disabling of the operation of the pull-up assist module may be based on the aforementioned and described SVS signal or another signal.

Figure 10:
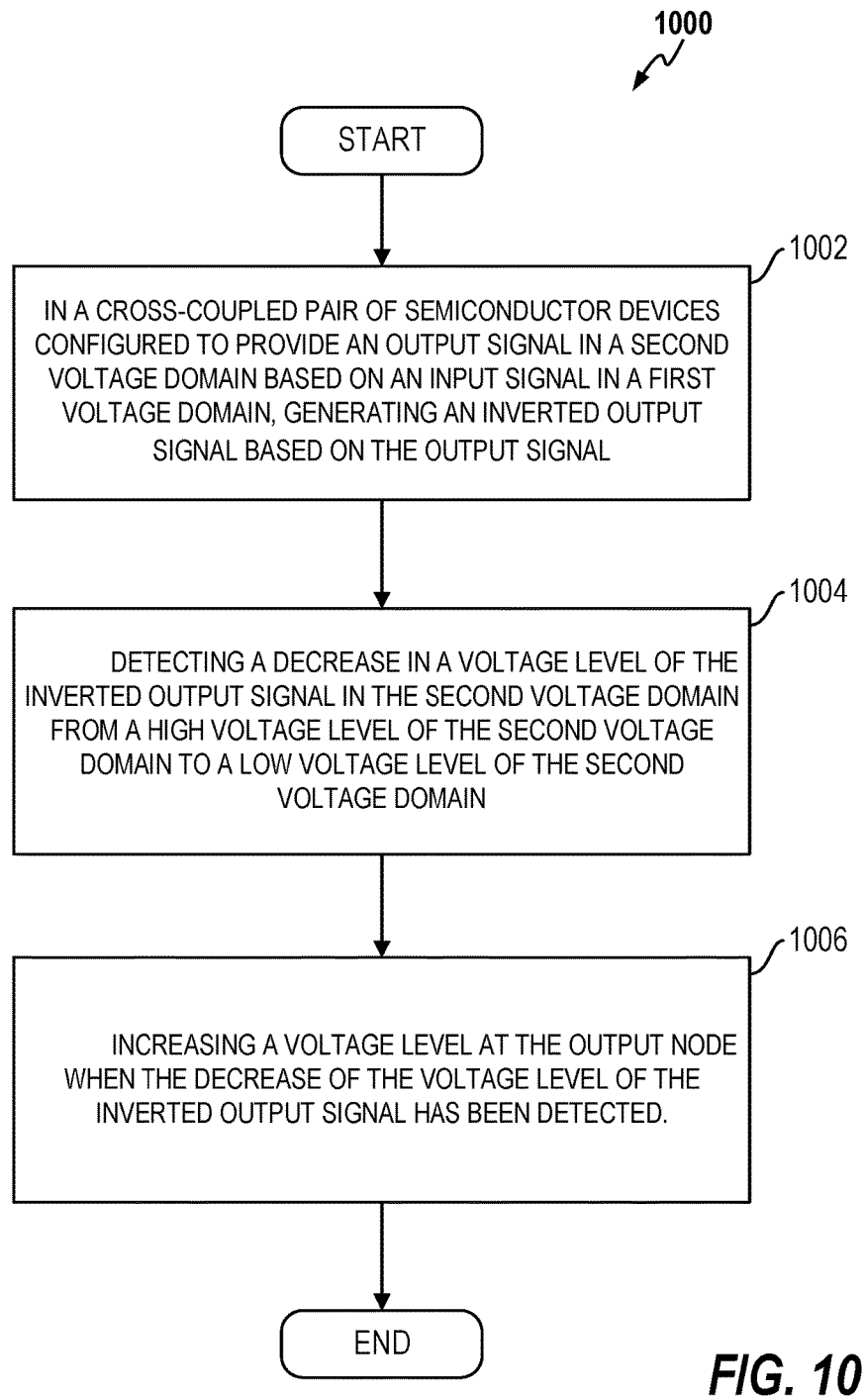
FIG. 10 is a flow diagram illustrating a level-shifting operation.

FIG. 10 illustrates a process 1000 for operation of a level shifter in accordance with various aspects of the disclosed high-speed level shifter, where at 1002, in a cross-coupled pair of semiconductor devices configured to provide an output signal in a second voltage domain based on an input signal in a first voltage domain, an inverted output signal is generated based on the output signal. An example of the cross-coupled pair of semiconductor devices has been described herein with reference to FIG. 2 as part of the cross-coupled pair of transistor chains including the first transistor chain with the NMOS transistor 202, the PMOS transistor 204, and the PMOS transistor 206; and, the second transistor chain with the NMOS transistor 212, the PMOS transistor 214, and the PMOS transistor 216.

At 1004, a decrease in a voltage level of the inverted output signal in the second voltage domain from a high voltage level of the second voltage domain to a low voltage level of the second voltage domain is detected; and At 1006, a voltage level at the output node is increased when the decrease of the voltage level of the inverted output signal has been detected.

Figure 11:
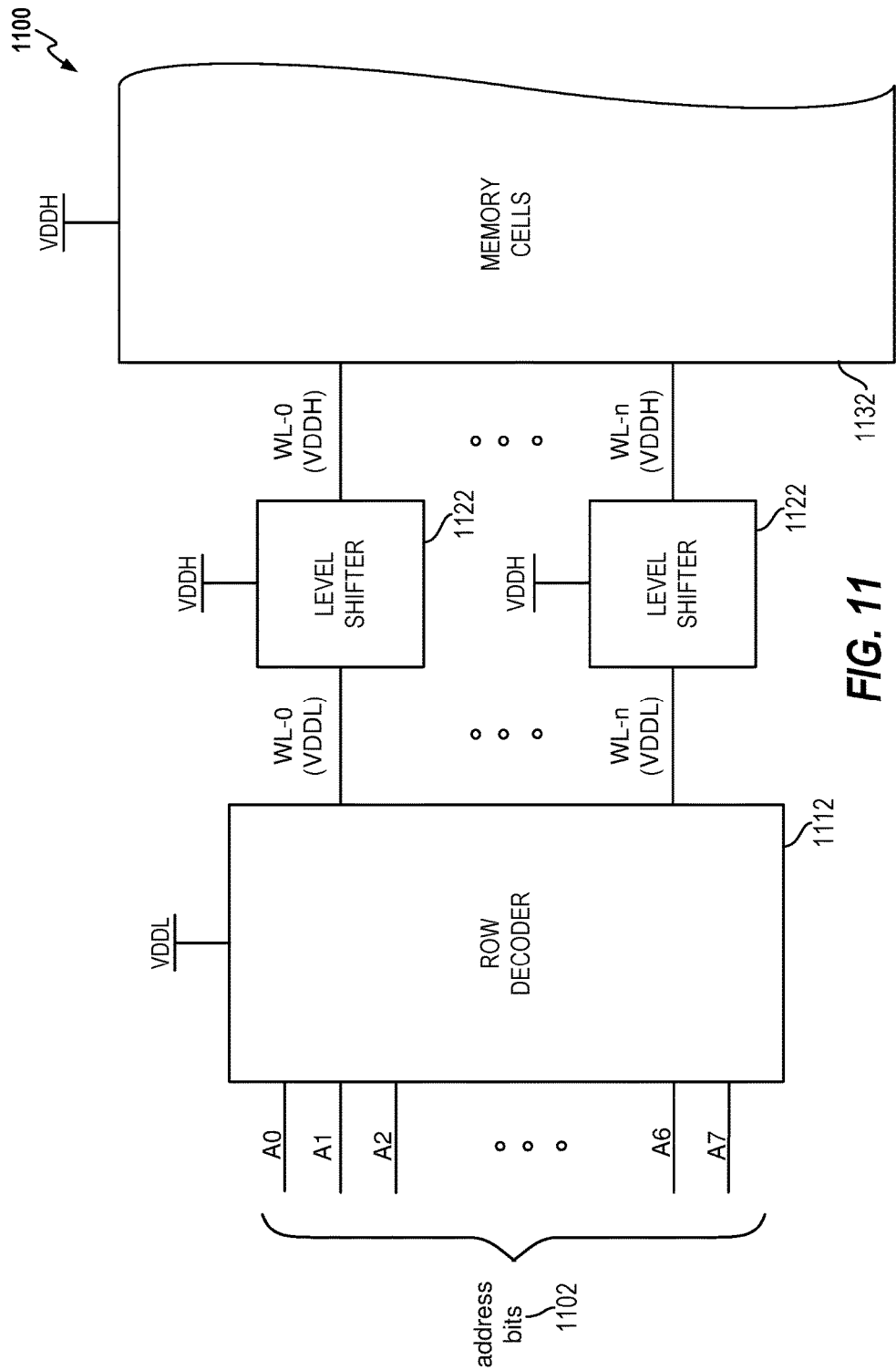
FIG. 11 is a block diagram illustrating an example of a memory in which level shifters configured in accordance with various aspects of the high-speed level shifter disclosed herein may be used.

FIG. 11 illustrates relevant portions of an example memory access scheme 1100 in which level shifters configured in accordance with various aspects of the disclosed high-speed level shifter may be implemented. The memory access scheme 1100 may include a plurality of word lines ranging from 0 to n provided to select various cells in a plurality of memory cells 1132. For example, if there are two hundred and fifty-six (256) word lines, then n equals 255 and the plurality of word lines ranges from a first word line (WL-0) to a final word line (WL-255). It will be appreciated, however, that the number of word lines in the plurality of word lines may be greater than or less than 256 in alternative implementations. An 8-bit address 1102 is thus sufficient to select for any one of the 256 word lines, where the address 1102 includes a plurality of bits ranging from a first address bit A0 through a last address bit A7. A logic-power-domain row decoder 1112 may be used to decode the address 1102. The row decoder 1112 may be a part of a processor or processing system (not shown). Further, the various modules and components shown in FIG. 11 may be incorporated as a part of a processor or processing system. For example, a single integrated processing system may include one or more processors that interface with one or more memory subsystems in a single semiconductor device.

The logic power domain is powered by a logic power supply voltage VDDL. The row decoder 1112 is thus coupled to a logic domain power supply node supplying the logic power supply voltage VDDL. In contrast to the row decoder 1112, a plurality of level shifters 1122 operate within a memory power domain powered by a memory power supply voltage VDDH that is distinct from the logic power supply voltage VDDL. The plurality of memory cells 1132 also operates in the memory power domain. In general, the relative levels for the logic power supply voltage VDDL and the memory power supply voltage VDDH will depend upon the mode of operation for the integrated circuit including the memory access scheme 1100.

Should the logic power domain be in a standby or low power mode of operation, the memory power supply voltage VDDH may be higher than the logic power supply voltage VDDL. Conversely, should the logic power domain be in a high-power mode whereas the memory power domain is in a low power mode of operation, the logic power supply voltage VDDL may be higher than the memory power supply voltage VDDH. Typically, the logic power supply voltage VDDL is lower than the memory power supply voltage VDDH so the following discussion will assume that the memory power supply voltage VDDH is indeed greater than logic power supply voltage VDDL. However, it will be appreciated that the level-shifting disclosed herein may also be applicable to level shifting down in amplitude with regard to driving the word lines.

In FIG. 11, if n equals 256, the row decoder 1112 may decode the address 1102 into 256 different decoded signals such that the decoded signals correspond on a one-to-one basis with the word lines. It will be appreciated that in some implementations the row decoder 1112 may be configured to decode subsets of address bits of the address 1102 into a plurality of corresponding decoded signals. In other words, instead of decoding the entire address into a single decoded signal that individually corresponds to a particular word line, the row decoder 1112 may be configured to decode three address bits (for example, address bits A0, A1, and A2) into a first set of decoded signals (RA) that ranges from RA0 to RA7 (not shown); another three address bits (for example, address bits A3, A4, and A5) into a second set of decoded signals that ranges from RB0 through RB7 (not illustrated); and a remaining two address bits such as address bits A6 and A7 into a third set of decoded signal that ranges from RC0 through RC3 (not shown).

In order to avoid unnecessary complication of the description of FIG. 11, it will be assumed that the row decoder 1112 is configured to produce n different decoded signals and each word line (WL-0 to WL-n) has its own corresponding level-shifter 1122. Again, where n equals 256, there are thus 256 level shifters 1122 corresponding to the 256 word lines (WL-0 to WL-255), each level shifter operating to shift a received word line signal from the logic power supply voltage VDDL of the logic power domain to the memory power supply voltage VDDH for the memory power domain in accordance with the various aspects of the high-speed level shifter described herein. Once shifted, the word line signals may be used to access the plurality of memory cells 1132 as understood by those of ordinary skill in the art.

For example, if the row decoder 1112 asserts a word line signal WL-5 (VDDL), then the level shifter coupled to that word line would shift the word line signal to generate a word line signal WL-5 (VDDH) to access the plurality of memory cells 1132. Referring back to the level shifter 200 described and illustrated with regards to FIG. 2, the word line signal WL-5 (VDDL) would be received at the input node IN and provide an output at the output node OUT of the word line signal WL-5 (VHHD).

In accordance with various aspects of the disclosed high-speed level shifter, the various described level shifters include an output node and a cross-coupled pair of semiconductor devices configured to provide, at the output node, an output signal in a second voltage domain based on an input signal in a first voltage domain. The level shifters include pull-up assist means for increasing a voltage level at the output node of the level shifter. The pull-up assist means may be implemented as described using any of the pull-up assist modules described herein, such as the pull-up assist module 230 described in FIG. 2, or the pull-up assist module 430 described in FIG. 4.

The level shifters described herein may also include look-ahead means for causing the pull-up assist means to increase the voltage level at the output node when there is a decrease in a voltage level of an inverted output signal in the second voltage domain from a high voltage level of the second voltage domain to a low voltage level of the second voltage domain. The look-ahead means may be implemented as described using any of the look-ahead modules described herein, such as the look-ahead module 220 described in FIG. 2, or the look-ahead module 420 described in FIG. 4. The look-ahead means may further be implemented as described using look-ahead modules such as the look-ahead module 620 described in FIG. 6, the look-ahead module 720 described in FIG. 7, the look-ahead module 820 described in FIG. 8, and the look-ahead module 920 described in FIGS. 9.

In general, the aforementioned means may be any module, or one or more modules, described herein that is, or are, configured to perform the functions recited by the aforementioned means.

Several aspects of a high-speed level shifter have been presented with reference to a memory system. As those skilled in the art will readily appreciate, various aspects described throughout this disclosure may be extended to other devices that may utilize level shifting functionality.

The various illustrative logical blocks, modules, and circuits described in connection with the aspects disclosed herein may be implemented within an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A circuit, comprising:
   an output node;
   a cross-coupled pair of semiconductor devices configured to provide, at the output node, an output signal in a second voltage domain based on an input signal in a first voltage domain;
   a pull-up assist circuit coupled to the output node; and
   a look-ahead circuit coupled to the pull-up assist circuit, wherein the look-ahead circuit is configured to cause the pull-up assist circuit to assist in increasing a voltage level at the output node when there is a decrease in a voltage level of an inverted output signal in the second voltage domain from a high voltage level of the second voltage domain to a low voltage level of the second voltage domain.

2. The circuit of claim 1, wherein the look-ahead circuit is configured to cause the pull-up assist circuit to store a pre-charge when the inverted output signal is transitioning to the high voltage level of the second voltage domain and enable the pull-up assist circuit to increase a charge at the output node using the pre-charge when the inverted output signal is transitioning to the low voltage level of the second voltage domain.

3. The circuit of claim 1, wherein the look-ahead circuit is configured to disable the pull-up assist circuit in a voltage scaling mode, wherein during the voltage scaling mode an operating voltage level of the first voltage domain is lowered.

4. The circuit of claim 1, wherein the pull-up assist circuit comprises a first semiconductor device coupled to, and configured to be switched by, the look-ahead circuit to allow accumulation of charge at a pull-up node; and a second semiconductor device coupled to the first semiconductor device to allow the accumulated charge at the pull-up node to be provided to the output node based on the inverted output signal.

5. The circuit of claim 4, wherein the first semiconductor device comprises a transistor having a gate, and the look-ahead circuit comprises an output coupled to the gate of the transistor.

6. The circuit of claim 4, wherein the second semiconductor device comprises a transistor having a drain coupled to the output node.

7. The circuit of claim 4, further comprising a pull-down semiconductor device configured to reduce the voltage level of the output signal at the output node, wherein the second semiconductor device of the pull-up assist circuit is sized based on the pull-down semiconductor device.

8. The circuit of claim 1, wherein the look-ahead circuit comprises an inverter having an input configured to receive a signal based on the output signal.

9. A circuit, comprising:
   an output node;
   a cross-coupled pair of semiconductor devices configured to provide, at the output node, an output signal in a second voltage domain based on an input signal in a first voltage domain;
   pull-up assist means for increasing a voltage level at the output node; and
   look-ahead means for causing the pull-up assist means to increase the voltage level at the output node when there is a decrease in a voltage level of an inverted output signal in the second voltage domain from a high voltage level of the second voltage domain to a low voltage level of the second voltage domain.

10. The circuit of claim 9, wherein the look-ahead means is configured to cause the pull-up assist means to store a pre-charge when the inverted output signal is transitioning to the high voltage level of the second voltage domain and enable the pull-up assist means to increase a charge at the output node using the pre-charge when the inverted output signal is transitioning to the low voltage level of the second voltage domain.

11. The circuit of claim 9, wherein the look-ahead means is configured to disable the pull-up assist means in a voltage scaling mode, wherein during the voltage scaling mode an operating voltage level of the first voltage domain is lowered.

12. The circuit of claim 9, wherein the pull-up assist means comprises a first semiconductor means coupled to, and configured to be switched by, the look-ahead means to allow accumulation of charge at a pull-up node; and a second semiconductor means coupled to the first semiconductor means to allow the accumulated charge at the pull-up node to be provided to the output node based on the inverted output signal.

13. The circuit of claim 12, wherein the first semiconductor means comprises a transistor having a gate, and the look-ahead means comprises an output coupled to the gate of the transistor.

14. The circuit of claim 12, wherein the second semiconductor means comprises a transistor having a drain coupled to the output node.

15. The circuit of claim 12, further comprising a pull-down semiconductor means configured to reduce the voltage level of the output signal at the output node, wherein the second semiconductor means of the pull-up assist means is sized based on the pull-down semiconductor means.

16. The circuit of claim 9, wherein the look-ahead means comprises an inverter having an input configured to receive a signal based on the output signal.

17. A method, comprising:
in a cross-coupled pair of semiconductor devices configured to provide an output signal in a second voltage domain based on an input signal in a first voltage domain, generating an inverted output signal based on the output signal;
detecting a decrease in a voltage level of the inverted output signal in the second voltage domain from a high voltage level of the second voltage domain to a low voltage level of the second voltage domain; and
increasing a voltage level at the output node when the decrease of the voltage level of the inverted output signal has been detected.

18. The method of claim 17, further comprising:
storing a pre-charge when a transition of the inverted output signal towards the high voltage level of the second voltage domain is detected.

19. The method of claim 18, further comprising:
increasing a charge at the output node using the pre-charge when the inverted output signal is transitioning to the low voltage level of the second voltage domain.

20. The method of claim 19, wherein increasing the charge at the output node comprises:
switching a first semiconductor device to allow accumulation of the pre-charge at a pull-up node; and
switching a second semiconductor device coupled to the first semiconductor device to allow the pre-charge at the pull-up node to be provided to the output node based on the inverted output signal.

21. A processing system comprising:
a memory circuit configured to operate in a first voltage domain;
a processing circuit configured to operate in a second voltage domain and further configured to access the memory circuit using an address signal; and
a level shifter coupled to the processing circuit and the memory circuit and configured to translate the address signal, the level shifter comprising:
an output node;
a cross-coupled pair of semiconductor devices configured to provide, at the output node, an output signal in the second voltage domain based on the address signal in the first voltage domain;
a pull-up assist circuit coupled to the output node; and
a look-ahead circuit coupled to the pull-up assist circuit, wherein the look-ahead circuit is configured to cause the pull-up assist circuit to assist in increasing a voltage level at the output node when there is a decrease in a voltage level of an inverted output signal in the second voltage domain from a high voltage level of the second voltage domain to a low voltage level of the second voltage domain.

22. The processing system of claim 21, wherein the look-ahead circuit is configured to cause the pull-up assist circuit to store a pre-charge when the inverted output signal is transitioning to the high voltage level of the second voltage domain and enable the pull-up assist circuit to increase a charge at the output node using the pre-charge when the inverted output signal is transitioning to the low voltage level of the second voltage domain.

23. The processing system of claim 21, wherein the look-ahead circuit is configured to disable the pull-up assist circuit in a voltage scaling mode, wherein during the voltage scaling mode an operating voltage level of the first voltage domain is lowered.

* * * * *